United States Patent [19]
Krusell et al.

[11] Patent Number: 5,853,522
[45] Date of Patent: Dec. 29, 1998

[54] DRIP CHEMICAL DELIVERY APPARATUS

[75] Inventors: Wilbur C. Krusell; Lane L. Larson, both of San Jose, Calif.

[73] Assignee: OnTrak Systems, Incorporated, San Jose, Calif.

[21] Appl. No.: 688,257

[22] Filed: Jul. 29, 1996

Related U.S. Application Data

[62] Division of Ser. No. 617,434, Mar. 18, 1996, which is a continuation of Ser. No. 275,785, Jul. 15, 1994, abandoned.

[51] Int. Cl.$^6$ .................................................. H01L 21/00
[52] U.S. Cl. .................... 156/345; 156/638.1; 156/639.1
[58] Field of Search ................................ 156/345, 636.1, 156/639.1, 640.1, 638.1; 134/1.3, 6, 201, 902

[56] References Cited

U.S. PATENT DOCUMENTS

| | | |
|---|---|---|
| 3,411,973 | 11/1968 | Siler . |
| 3,616,049 | 10/1971 | Moore et al. ........................ 156/345 |
| 3,691,582 | 9/1972 | Call . |
| 3,928,064 | 12/1975 | Holm . |
| 4,569,695 | 2/1986 | Yamashita et al. . |
| 4,578,120 | 3/1986 | Chiarella . |
| 4,730,360 | 3/1988 | Brugelmann . |
| 4,862,570 | 9/1989 | Bald et al. . |
| 4,954,141 | 9/1990 | Takiyama et al. ................ 156/636.1 X |
| 5,131,968 | 7/1992 | Wells et al. . |
| 5,392,491 | 2/1995 | Hwang et al. . |
| 5,398,363 | 3/1995 | Mederaris et al. . |

*Primary Examiner*—William Powell
*Attorney, Agent, or Firm*—Blakely, Sokoloff, Taylor & Zafman LLP

[57] ABSTRACT

A drip chemical delivery system used in semiconductor substrate cleaning processes. A drip chemical delivery system which uses small openings in a pipe (holes) and a low air pressure to saturate the brushes in a double sided brush system. This drip delivery system reduces the volumes of chemical solutions used in a scrubbing process and helps to maintain control of the pH profile of a substrate. This system is described and illustrated in the manner it is used in conjunction with a double sided scrubber.

22 Claims, 3 Drawing Sheets

FIG. 2b (Present Invention)

DRIP CHEMICAL DELIVERY APPARATUS

This is a divisional of application Ser. No. 08/617,434, filed Mar. 18, 1996, which is a continuation of application Ser. No. 08/275,785, filed Jul. 15, 1994, now abandoned.

BACKGROUND OF THE INVENTION

1. Field of the Invention

This invention relates to methods of processing a substrate, and more specifically, to a method and apparatus for the delivery of chemical solutions during the cleaning process of, for example, semiconductor wafers.

2. Prior Art

In the manufacture of semiconductor devices, the surface of semiconductor wafers must be cleaned of wafer contaminants. If not removed, wafer contaminants may affect device performance characteristics and may cause device failure to occur at faster rates than usual.

In general, there are two types of wafer contamination: particulates and films. Particulates are any bits of material present on a wafer surface that have readily definable boundaries, for example, silicon dust, atmospheric dust, plastic particles, and silicate particles. Films are layers of foreign material on wafer surfaces, for example, metallic films, photoresist residues, and solvent residues. It should be noted that films may break loose and become particles, for example, surface metals.

As there are two types of wafer contamination there are also separate cleaning procedures to remove each of them. Film contaminants are generally removed by chemical cleaning processes and particulates are generally removed by ultrasonic scrubbing or a combination of high pressure spraying and mechanical scrubbing.

The most commonly used chemical cleaning process is the RCA method. The RCA method is used for cleaning bare silicon or silicon wafers which only have thermally grown oxides. This process consists of six steps. First, there is a preliminary cleaning of the wafer. The wafer is immersed in a sulfuric acid-oxidant mixture (such as $H_2SO_4$—$H_2O_2$) which removes the photoresist present on the wafer. Often, even if the resist has previously been stripped, the wafer is immersed into the above described sulfuric acid-oxidant mixture to prepare the wafer surface for the next step in the process. When the wafers are removed from the sulfuric-oxidant mixture they are then rinsed in 18°–23° C. deionized and filtered water. Such water is also used for all other rinse steps of the RCA method.

The second step of the RCA method is the removal of residual organic contaminants and certain metals. A fresh mixture of water, ammonium hydroxide, and hydrogen peroxide ($H_2O$—$NH_4OH$—$H_2O_2$, 5:1:1 by volume) is prepared and heated to approximately 75°–80° C. The wafers are then submersed into the solution for approximately 10–15 minutes, while the temperature is maintained at approximately 80° C. The wafers are then rinsed for approximately 1 minute in deionized water.

If a thermally grown silicon dioxide film does not completely cover the wafer, then the third step of the RCA method comprises stripping of the hydrous oxide film formed in step two. The wafers are submersed into a mixture of hydrofluoric acid and water (HF—$H_2O$, 1:10 by volume). Following immersion in the hydrofluoric acid, the wafers are rinsed, but only for 20–30 seconds. The short rinse minimizes regrowth of the oxide.

The fourth step of the RCA method is desorption of the remaining atomic and ionic contaminants. A fresh mixture of water, hydrochloric acid, and hydrogen peroxide ($H_2O$—HCl—$H_2O_2$, 6:1:1 by volume) is prepared and heated to approximately 75°–80° C. The wafers are submerged into the solution for 10–15 minutes and are then rinsed in deionized water.

Steps five and six comprise drying and storing the wafers, respectively. It should be noted that in all the steps previous to drying, the wafers are kept wet in between each of the steps.

The RCA method is widely used but still has some problems. One problem is that it uses large volumes of chemical solutions. Another problem with the RCA method is that almost every step concludes with a deionized water rinse. Thus, the process as a whole consumes a large amount of water.

An improvement to the RCA method is the use of centrifugal spray cleaning rather than immersion cleaning in solutions. The process of centrifugal spray cleaning operates by using a sequence of fine sprays of cleaning solutions and high purity water to wet the wafers, which are enclosed in a chamber purged with $N_2$. There are many advantages to using centrifugal spray cleaning instead of immersion cleaning in solutions, for example: smaller volumes of chemicals and deionized water are consumed (approximately two thirds less) and wafer surfaces are continually exposed to fresh reagent solutions. Another benefit of centrifugal spray cleaning is that since the wafers do not have to be transferred from one solution to another the system may be automated thus allowing the environment of the process to be carefully controlled.

One method for removal of insoluble particulate contamination is Ultrasonic Scrubbing. In ultrasonic scrubbing wafers are immersed in a suitable liquid medium to which sonic energy in the range of 20,000 to 50,000 Hz is applied. Cavitation, the rapid forming and collapsing of microscopic bubbles in the liquid medium under the pressure of sonic agitation, produces shock waves which impinge on wafer surfaces. The shock waves displace and loosen particulate matter. An improvement upon ultrasonic scrubbing is the megasonic bath. The megasonic bath incorporates the same principles as ultrasonic scrubbing, however, the megasonic bath uses higher frequency sonic waves, approximately 850 kHz. Also, the megasonic bath may be operated with the same solutions used in the RCA chemical film removal process. The use of the RCA solutions in the megasonic bath allows chemical cleaning and contaminate desorption while simultaneously removing particulates. The problem with ultrasonic scrubbing and the megasonic bath is that they both use large volumes of chemical solutions to remove contaminants.

Another method for the removal of insoluble particulate contamination is the combination of High Pressure Spraying and Brush Scrubbing. There are two types of brush scrubbing for silicon wafers: single sided scrubbing and double sided scrubbing, both work in substantially the same manner. During scrubbing a brush is rotated across the surface of the wafer. The brush does not actually touch the wafer, but hydroplanes over its surface. The brush (or brushes) impart motion to the solvents of the scrubber and the moving solvent dislodges particulates. High pressure jet spraying is almost always used with brush scrubbing. The high pressure jet sprays deionized water, at a pressure of approximately 13.8–20.7 MPa, across the surface of the wafer and removes the particulates dislodged by the brush as well as any residual particles generated by the brush.

The common problem to all the above mentioned wafer cleaning methods is that they all either submerse the substrates to be cleaned in the solution or they spray the substrate with the solution thus using large volumes of chemical solutions. A problem with the methods that use spray cleaning is that chemical solutions are in essence dumped onto the substrate with very little control over the pH profile of the substrate being cleaned. If the pH profile is not controlled, then damage may result to the substrate.

What is needed is a method and apparatus, which may be used in existing cleaning systems, which apply the cleaning solutions in a manner that allows greater control of the pH profile of the substrate surface, but that does not use large amounts of chemicals.

SUMMARY OF THE INVENTION

The present invention describes a method and apparatus wherein chemicals are delivered to a substrate cleaning system through a small hole in a pipe at low pressure, such that the apparatus decreases chemical usage by approximately 66–90 percent.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures and in which:

FIG. 2b is a side view of a preferred embodiment of the present invention as used in the brush stations of the Double Sided Scrub (DSS) System in FIG. 1.

FIG. 3b illustrates the pH profile of a substrate in a DSS system incorporating a preferred embodiment of the present invention.

DETAILED DESCRIPTION

Figure 1:
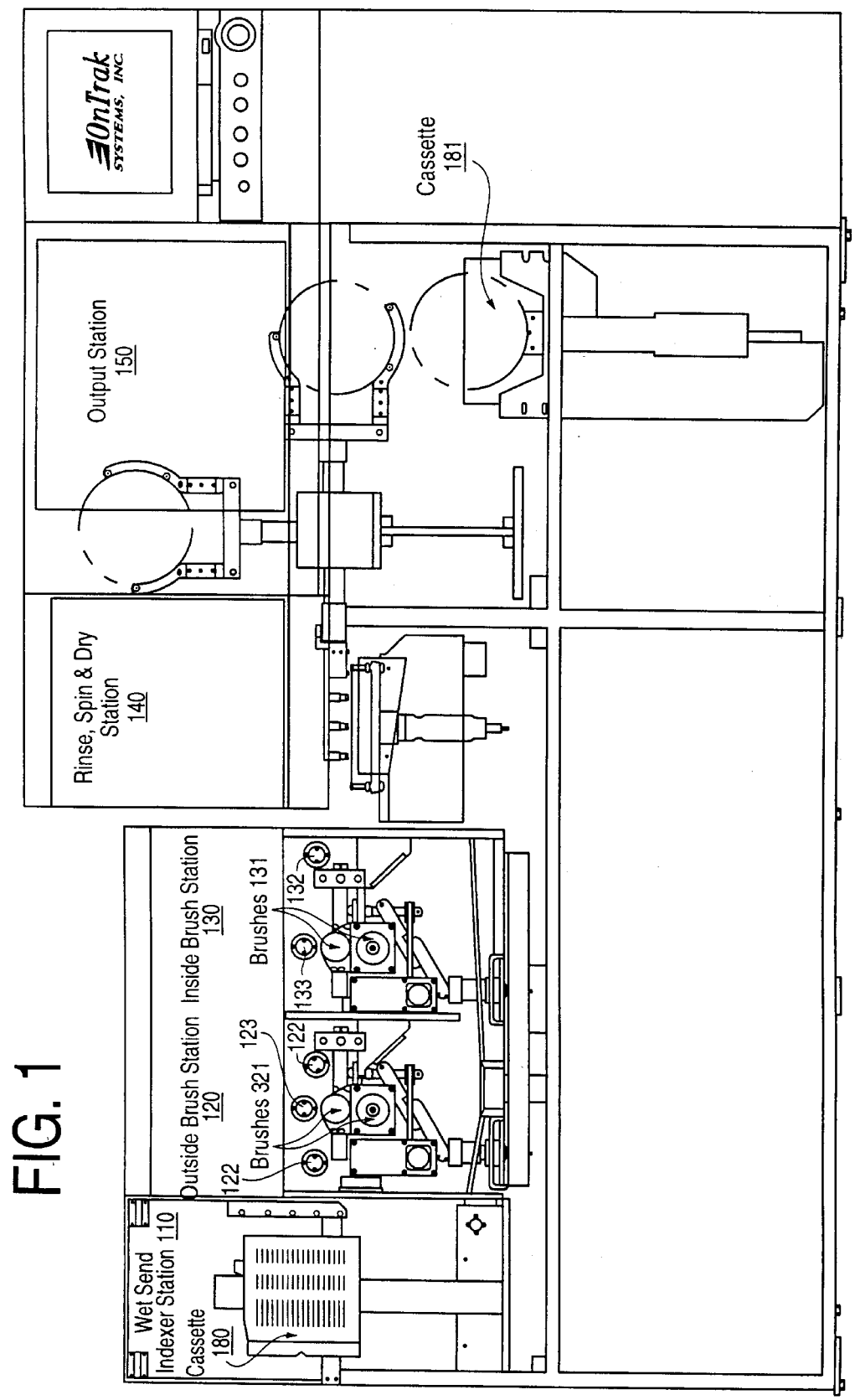
FIG. 1 is a cross-sectional view of a Double Sided Scrub (DSS) System.

A method and apparatus for a drip chemical delivery system is disclosed. In the following description, numerous specific details are set forth such as specific process steps, process parameters, materials, solutions, and etc., in order to provide a thorough understanding of the present invention. It will be obvious, however, to one skilled in the art that these specific details need not be employed to practice the present invention. In other instances, well known process steps and materials have not been described in detail in order to avoid unnecessarily obscuring the present invention.

The present invention may be employed in a number of substrate cleaning procedures. Although the present invention is described in conjunction with the scrubbing of a wafer, it will be appreciated that any similarly shaped, i.e. generally flat substrate, may be processed by the methods and apparati of the present invention. Further, it will be appreciated that reference to a wafer or substrate may include a bare or pure semiconductor substrate, with or without doping, a semiconductor substrate with epitaxial layers, a semiconductor substrate incorporating one or more device layers at any stage of processing, other types of substrates incorporating one or more semiconductor layers such as substrates having semiconductor on insulator (SIO) devices, or substrates for processing other apparati and devices such as flat panel displays, multichip modules, etc. However, to avoid obscuring the invention the following description will describe wafer cleaning in general and as an example of a preferred embodiment will describe the use of the present invention in a scrubbing process.

During semiconductor processing and during semiconductor wafer cleaning, substrates pick up contaminants. In general, there are two types of contaminants: particles and films.

There are many processes which remove contaminants from the substrate surface, such as the RCA method, ultrasonic scrubbing, megasonic bath, and brush scrubbing in combination with high pressure spraying (brush scrubbing). Each of these processes may be performed in different embodiments or systems, for example, brush scrubbing may be accomplished using a single sided brush scrub system or a double sided brush scrub system. No matter what embodiment is used for a particular cleaning process, all the processes still have the problem of using large volumes of chemical solutions in removing contaminants from the substrate.

As an example, and not by limitation, the present invention is described in conjunction with a scrubbing process, more specifically, a double sided scrubbing process. The scrubber includes a number of stations. Each of these stations represents one or more steps in the substrate cleaning process. Contaminated substrates are loaded at one end of the system and noncontaminated or less-contaminated substrates are unloaded from the other end of the system. An example of a system of this type is the DSS-200 Double Sided Scrubber available from OnTrak Systems, Inc. of Milpitas, Calif.

FIG. 1 represents a cross sectional view of a DSS System Configuration (cleaning system). Usually, the contaminated substrates 100 are delivered to the cleaning system after chemical mechanical polishing (CMP) or from a wet bench. At the start of the cleaning process contaminated substrates are loaded into a wafer cassette 180 (cassette) and the cassette 180 is then placed into the wet send indexer station 110.

In the wet send indexer station 110, the surface state of the substrates is changed from hydrophobic to hydrophilic. To accomplish this the substrates may be submersed in a citric acid and hydrogen peroxide solution whose pH level has been adjusted to approximately 6.5–14. The pH level of the citric acid and hydrogen peroxide solution may be adjusted by adding a basic compound. In a currently preferred embodiment, ammonium hydroxide is used as the basic compound. It should be noted that in the above described preferred embodiment the hydrogen peroxide and ammonium hydroxide are approximately 28–30 percent concentrate reagents. Once the surface state of the substrates has been changed to hydrophilic then the substrates are automatically removed from the cassette 180 and placed, one at a time, into the outside brush station 120. A process to change the surface state of wafers from hydrophobic to hydrophilic is further described in the copending patent application entitled, "Method To Remove Metals In A Scrubber", by Wilbur C. Krusell, filed on even date herewith, which application is assigned to the assignee of the present application.

In the outside brush station 120 a substrate is processed through a first scrub. Water jets 121 and 122 keep the substrate wet during the first scrub. The substrate is treated with an ammonium hydroxide ($NH_4OH$) solution by chemical delivery system 121. The chemical delivery system 121 may apply the solution to the substrate in different ways. One prior art method is to spray the substrate surface with the chemicals. A new method is to drip the chemicals directly onto the brushes which in turn apply the chemicals to the substrate surface. A currently preferred embodiment of the drip chemical delivery system is discussed in detail below, following the overview of the scrub process.

The scrubbed substrate is then automatically removed from the outside brush station 120 and placed into the inside brush station 130. During the transfer from one brush station to the next the substrate is kept wet by water jets 122. In the inside brush station 130, the substrate is processed through a second scrub. The substrate is treated with a citric acid solution by chemical delivery system 131. As in the first scrub step, the chemical delivery system 131 may apply the citric acid solution using the prior art method of spraying the solution onto the substrate surface or using the new method described below of dripping the solution onto the brushes which in turn apply the solution to the substrate surface.

After the second scrub the substrate is then automatically removed from the inside brush station 130 and placed into the rinse, spin and dry station 140. During the transfer from inside brush station 130 to the rinse, spin, and dry station the substrate is kept wet by water jets 132. Rinse, spin, and dry station 140 rinses, spins, and dries the substrate. At this point the wafer has been cleaned. However, it should be noted that the substrate may be further cleaned with the use of another cleaning system such as a megasonic bath, single sided scrubber, etc.

Once the rinse, spin, and dry steps have been completed the substrate is then transported from the rinse, spin, and dry station 140 to the output station 150 where the substrate will be placed into cassette 181. The transfer is usually carried out by a robotic arm which lifts the substrate out of the rinse, spin, and dry station 140 by its edges and places it into the cassette 181. The cassette is then transferred to storage or to another cleaning or processing system.

It will be clear to one of ordinary skill in the art that some of the steps in the DSS system described above may occur in another order or with different solutions other than as presented. For example, the ammonium hydroxide and citric acid solutions used in the brush stations 120 and 130, respectively, may be reversed. As another example, different solutions, such as water, may be used in place of the ammonium hydroxide solution.

It should be noted that while the following description illustrates the use of the present invention in a double sided scrub system, the present invention may be used in other cleaning systems and processes. For example, single sided scrub systems, ultrasonic scrub systems, megasonic bath systems, and the RCA method.

As referred to above in the discussion of the brush stations, a chemical delivery system may apply the solutions to the substrates in different ways. One prior art method is to spray the substrate surface with the solutions (spray system) and a new method, disclosed below, is to drip the chemicals directly onto the brushes which in turn apply the solutions to the substrate surface (drip system).

Figure 2A:
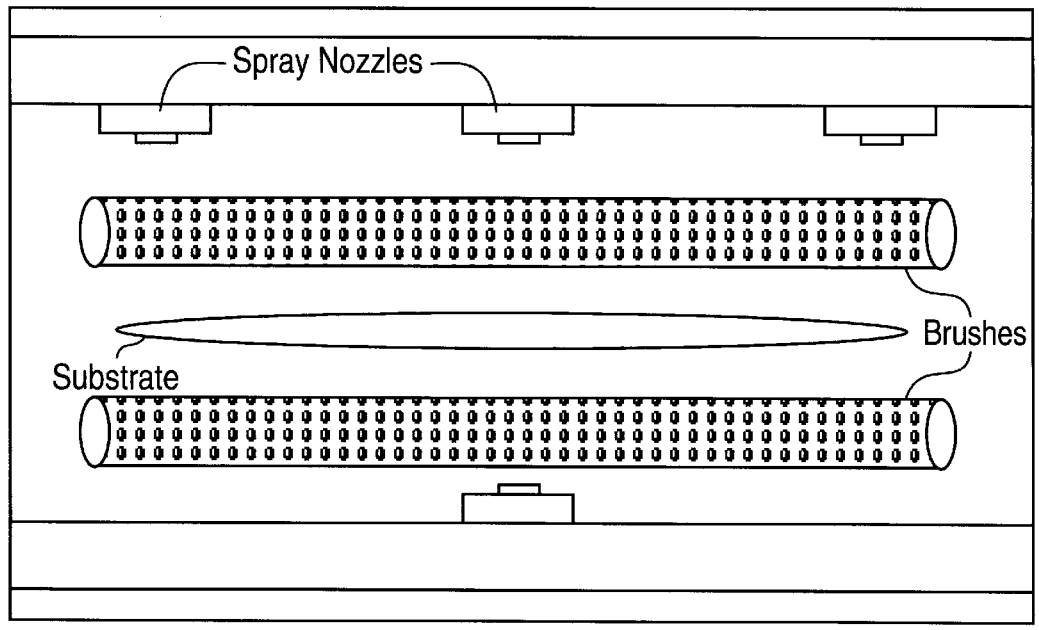
FIG. 2a is a side view of a spray delivery system as used in the brush stations of the Double Sided Scrub (DSS) System in FIG. 1.
Figure 2A:
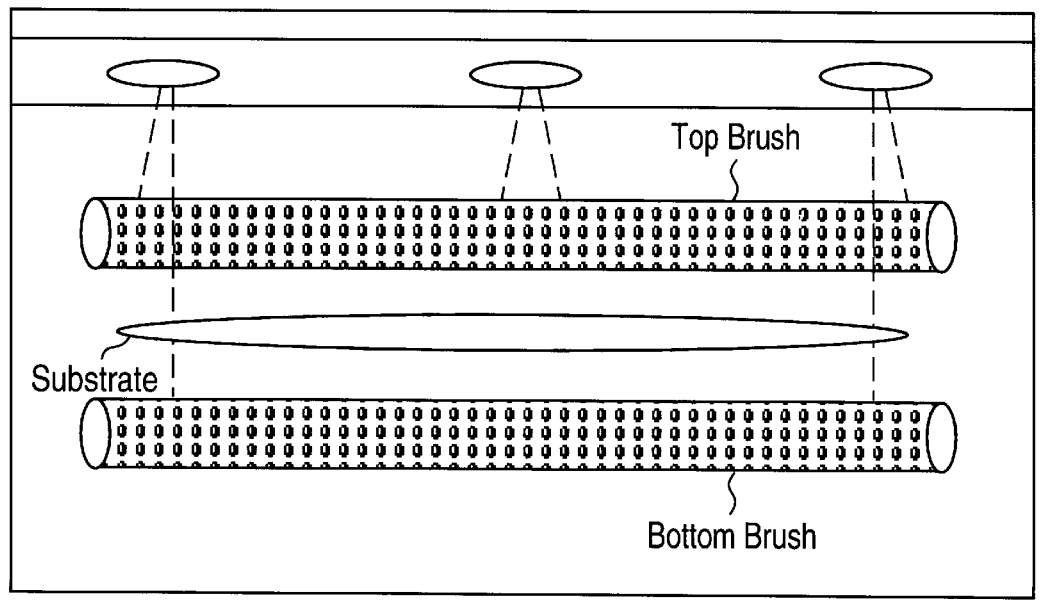

One preferred embodiment of a spray system comprises eight fan spray nozzles (four in each brush station) which use approximately 600 m/min. of solution for all eight nozzles spraying at a pressure of approximately 30–35 psig. A typical DSS system, as described above, uses approximately 125 ml/substrate of solution (12.5 seconds of solution applied per substrate) and processes approximately 45 substrates/hour. In other words, the diluted chemical solutions are used at a rate of approximately 5.625 liters/hour or approximately 135 liters/day. FIG. 2a illustrates a spray system as used in the brush stations of a typical DSS system. In general, in each brush station there are three spray nozzles located in a pipe above the brushes and one nozzle located in a pipe below the brushes which saturate the brushes and spray the surface of the substrate directly. The problem with the spray system is that large volumes of solutions are used coating areas other than the substrate where a more direct application of the solutions to the substrate uses smaller volumes. Maintaining control of the pH profile of the substrate surface is another problem with the spray delivery system. Since the spray system uses relatively quick bursts of high pH solutions the pH profile of the surfaces may change rapidly and may not be easily controlled. If the pH profile of the surface is not controlled damage may result to the substrate.

The drip chemical delivery system (drip system) drips the solution, for example the ammonium hydroxide solution described above, onto the brushes of the brush station. The brushes become saturated with the chemical solution and in turn apply the chemical solutions to the substrate surface. The drip system uses smaller volumes of the solutions than the spray system. A preferred embodiment of the drip system is illustrated in FIG. 2b. In general, there are three holes located in a pipe above the brushes. One hole is located near the center of the pipe so that when the solution is applied it drips onto the top brush. The other two holes are spaced far enough apart so that when the solution is applied it drips to the sides of the substrate and onto the top and bottom brushes. The brushes may generally be selected from two types: brittle and sponge brushes. In a currently preferred embodiment of the present invention, PVA sponge brushes are used. Thus, the drip system saturates both brushes and the brushes in turn apply the solutions to the substrate.

In a preferred embodiment of the drip system, the solution is pushed through small holes, with a diameter of approximately 0.023–0.032 inches at an air pressure of approximately 5–8 psig. A typical DSS system incorporating a drip system uses solutions at a rate of 1.575 liters/hour or approximately 37.8 liters per day.

Comparing a drip system at approximately 5–8 psig (for approximately 30–35 seconds/wafer) and a spray system at approximately 30–35 psig (for approximately 10–13 seconds/wafer) the amount of chemical solution used is decreased by approximately 66–90 percent using the drip system. As an example, the preferred embodiment described above decreased solution usage from approximately 125 ml/substrate to approximately 30–35 ml/substrate, a decrease of approximately 72 percent.

It will be clear to one with skill in the art that decreasing the hole diameters while increasing the air pressure (or vice versa) in a drip delivery system will produce similar results to the preferred embodiment described above. Also, it will be obvious to one with skill in the art that the drip system described above may be used with any solutions such as ammonium hydroxide, RCA solution SC-1, citric acid, or de-ionized water, etc. It will also be appreciated that the present invention may be used in other system, such as single sided scrubbers, for example. Further, it will be clear to one with skill in the art that a pipe with holes is only one embodiment and that alternative embodiments which drip solutions may be used, such as a slightly open valve (like a dripping faucet), a porous dripping material under appropriate pressure, or any type of nozzle coupled to a flow controller such that the nozzle drips at a desired rate, etc.

Another benefit of the drip system over the prior art spray system is that the drip system allows greater control over the pH profile of the substrate surface.

Figure 3A:
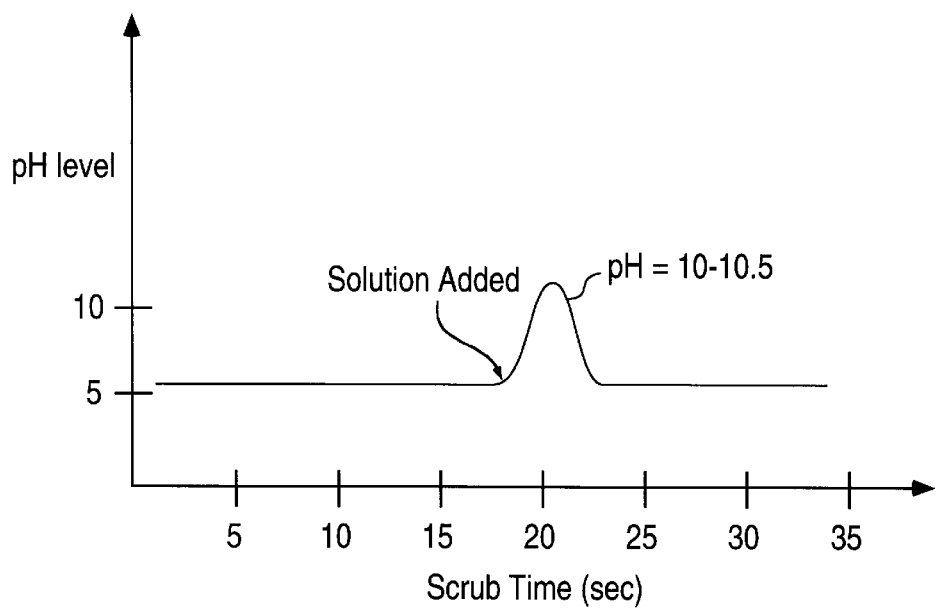
FIG. 3a illustrates the pH profile of a substrate in a DSS system incorporating a spray delivery system.
Figure 3A:
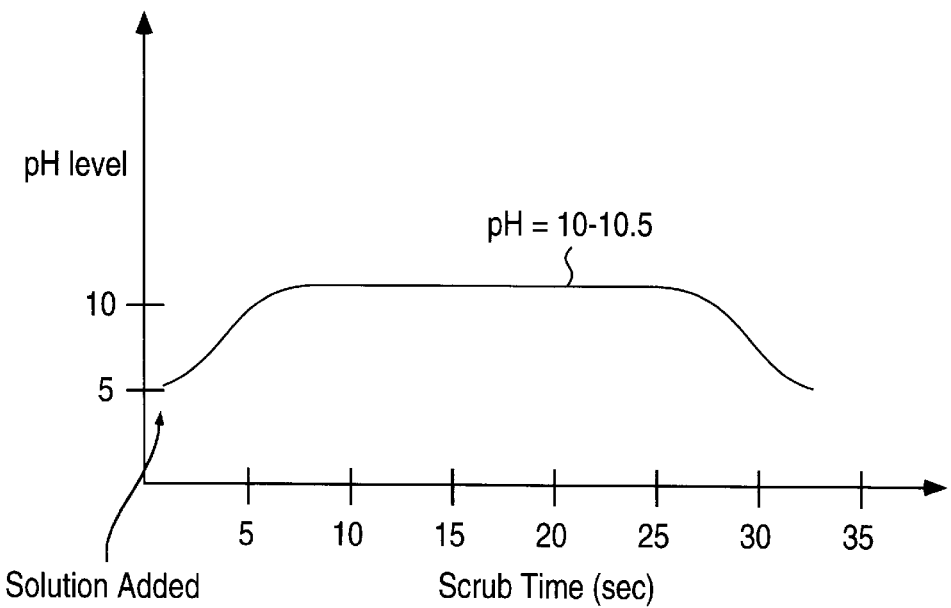

In the prior art, during the scrubbing process, the cleaning solution is essentially dumped on the wafer in a short burst to bring the pH to the desired level for contaminant removal. In a typical prior art spray system, the cleaning solution is sprayed onto the wafer for approximately 5 seconds of the scrubbing process. FIG. 3a illustrates a pH profile of a substrate in a prior art spray system. At the beginning of the scrubbing process, the pH level remains steady, then after approximately 17 seconds, a cleaning solution (with a pH level of approximately 11–12) is sprayed on the wafer quickly raising the pH level on the wafer surface to the desired pH for contaminant removal (approximately 10–10.5). The cleaning solution is only sprayed for approximately 5 seconds, and as the scrubbing process continues, the cleaning solution dissipates, thus lowering the pH level for the duration of the scrub. Because the cleaning solution used in the prior art spray system is generally of high pH and is dumped onto the wafer, the pH level at the surface of the wafer may spike above the desired level and damage the substrate.

In contrast, in the drip system of the present invention, the cleaning solution is applied to the wafer surface for a longer portion of the scrub keeping the pH at the desired level for contaminant removal for a longer more continuous period of time. FIG. 3b illustrates a pH profile of a substrate in a preferred embodiment of the present invention. The pH level starts lower, but as the cleaning solution (with pH of approximately 10–10.5) is dripped onto the brushes and the brushes become saturated (thus applying the solution to the wafer surface), the pH of the wafer surface raises to the desired level for contaminant removal (approximately 10–10.5). The cleaning solution is applied for approximately 30–35 seconds and as the scrubbing process continues, the pH on the wafer surface remains at the desired level for contaminant removal. After the cleaning solution is no longer applied, the cleaning solution dissipates thus lowering the pH level for the duration of the scrub. Hence, the present invention allows greater control over the pH profile of the substrate surface. Thus, in the present invention, the pH at the surface of the wafer will not spike above the desired level for contaminant removal. Also, in the present invention, the pH at the surface of the wafer remains at the desired level for contaminant removal for a longer portion of the scrubbing process.

Thus, a method and apparatus for a drip chemical delivery system has been described. Although specific embodiments, including specific equipment, process steps, process parameters, materials, solutions, and etc. have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. An apparatus for cleaning a substrate comprising:
   a substrate holder;
   a brush to scrub said substrate;
   a drip mechanism to drip a solution on said brush.

2. The apparatus as described in claim 1 wherein said drip mechanism drips said solution on said brush at a pressure of approximately 5–8 psig.

3. The apparatus as described in claim 1 wherein said brush is a PVA brush.

4. The apparatus as described in claim 1 wherein said drip mechanism comprises a pipe having an opening therein.

5. The apparatus as described in claim 2 wherein said drip mechanism comprises a pipe having an opening therein.

6. The apparatus as described in claim 4 wherein said opening has a diameter in the range of approximately 0.023–0.032 inch.

7. The apparatus as described in claim 5 wherein said opening has a diameter in the range of approximately 0.023–0.032 inch.

8. The apparatus as described in claim 1 further comprising:
   a spray mechanism to rinse said substrate.

9. An apparatus for cleaning a substrate comprising:
   a substrate holder;
   a brush to scrub said substrate;
   a drip mechanism to drip a solution on said brush, wherein said drip mechanism drips said solution on said brush at a pressure of approximately 5–8 psig.

10. The apparatus as described in claim 9 further comprising:
    a spray mechanism to rinse said substrate.

11. The apparatus as described in claim 9 wherein said brush is a PVA brush.

12. The apparatus as described in claim 9 wherein said drip mechanism comprises a pipe having an opening therein.

13. The apparatus as described in claim 12 wherein said opening has a diameter in the range of approximately 0.023–0.032 inch.

14. A double sided scrubber:
    a substrate holder;
    a first brush and a second brush to scrub a substrate;
    a drip mechanism to drip a solution on said first brush and said second brush.

15. The double sided scrubber as described in claim 14 wherein said first brush scrubs a first side of said substrate, said second brush scrubs a second side of said substrate, wherein said first side of said substrate and said second side of said substrate are opposite one another.

16. The double sided scrubber as described in claim 14 further comprising:
    a spray mechanism to rinse said substrate.

17. The double sided scrubber as described in claim 14 wherein said drip mechanism drips said solution on said brush at a pressure of approximately 5–8 psig.

18. The double sided scrubber as described in claim 14 wherein said first brush and said second brush are PVA brushes.

19. The double sided scrubber as described in claim 14 wherein said drip mechanism comprises a pipe having an opening therein.

20. The double sided scrubber as described in claim 17 wherein said drip mechanism comprises a pipe having an opening therein.

21. The double sided scrubber as described in claim 19 wherein said opening has a diameter in the range of approximately 0.023–0.032 inch.

22. The double sided scrubber as described in claim 20 wherein said opening has a diameter in the range of approximately 0.023–0.032 inch.

* * * * *